US012609710B2

(12) United States Patent (10) Patent No.: US 12,609,710 B2
Miyata (45) Date of Patent: Apr. 21, 2026

(54) ELECTRONIC APPARATUS

(71) Applicant: FUJIFILM Corporation, Tokyo (JP)

(72) Inventor: Masahiko Miyata, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 150 days.

(21) Appl. No.: 18/488,965

(22) Filed: Oct. 17, 2023

(65) Prior Publication Data

US 2024/0146321 A1 May 2, 2024

(30) Foreign Application Priority Data

Oct. 26, 2022 (JP) ................................. 2022-171193

(51) Int. Cl.
*H03M 1/12* (2006.01)
*H03M 1/06* (2006.01)
*H03M 1/16* (2006.01)
*H03M 1/60* (2006.01)

(52) U.S. Cl.
CPC ....... *H03M 1/0629* (2013.01); *H03M 1/1255* (2013.01); *H03M 1/165* (2013.01); *H03M 1/60* (2013.01)

(58) Field of Classification Search
CPC .. H03M 1/0629; H03M 1/1255; H03M 1/165; H03M 1/60
See application file for complete search history.

(56) References Cited

U.S. PATENT DOCUMENTS

2006/0092063 A1* 5/2006 Ido ......................... H03F 3/217
                                                         341/144
2014/0191743 A1* 7/2014 O'Driscoll ............ H02M 3/157
                                                         323/282

FOREIGN PATENT DOCUMENTS

JP        2000175447        6/2000
JP        2006121549        5/2006
JP        2006121549 A  *  5/2006

* cited by examiner

*Primary Examiner* — Benyam Haile
(74) *Attorney, Agent, or Firm* — JCIPRNET

(57) ABSTRACT

An electronic apparatus includes: a processor; a first electronic circuit that outputs a pulse width modulation signal; a low-pass filter circuit that outputs a voltage based on the pulse width modulation signal; a second electronic circuit that outputs an analog signal by using the output voltage of the low-pass filter circuit; and a third electronic circuit that converts the analog signal into a digital signal, and the processor sets a frequency of the pulse width modulation signal to a frequency at which a noise component included in the digital signal is reduced in relation to a sampling frequency of the third electronic circuit.

16 Claims, 15 Drawing Sheets

111a

111b

180[deg]

VOLTAGE OF NOISE 1.5

1

0.5

0

−0.5

−1

−1.5

TIME

ELECTRONIC APPARATUS

CROSS-REFERENCE TO RELATED APPLICATIONS

The present application claims priority under 35 U.S.C. § 119 to Japanese Patent Application No. 2022-171193, filed on Oct. 26, 2022. The above application is hereby expressly incorporated by reference, in its entirety, into the present application.

BACKGROUND OF THE INVENTION

1. Field of the Invention

The present invention relates to an electronic apparatus.

2. Description of the Related Art

JP2006-121549A discloses a signal processing apparatus that controls a frequency (switching frequency of pulse width modulation (PWM) signal) of a periodic noise input to an analog/digital (A/D) converter and a sampling frequency of the A/D converter into a relationship of a rational number ratio to suppress a noise component in a frequency region equal to or lower than a Nyquist frequency and reduce an influence of an aliasing noise in a Nyquist region.

JP2000-175447A discloses a semiconductor integrated circuit device that performs PWM modulation on DC power supplied to a primary side of a transformer via a switching transistor and then outputs the modulated power via a rectifier diode, a capacitor, and a reactor (low pass filter (LPF)) to supply the output voltage to an A/D converter so that a switching frequency of a PWM control circuit and its harmonic frequency do not overlap a sampling frequency of the A/D converter.

SUMMARY OF THE INVENTION

One embodiment according to the technology of the present disclosure provides an electronic apparatus capable of reducing an influence of a noise from a PWM signal.

(1)

An electronic apparatus comprising: a processor; a first electronic circuit that outputs a pulse width modulation signal; a low-pass filter circuit that outputs a voltage based on the pulse width modulation signal; a second electronic circuit that outputs an analog signal by using the output voltage of the low-pass filter circuit; and a third electronic circuit that converts the analog signal into a digital signal, in which the processor sets a frequency of the pulse width modulation signal to a frequency at which a noise component included in the digital signal is reduced in relation to a sampling frequency of the third electronic circuit.

(2)

The electronic apparatus according to (1), in which the noise component is generated at a frequency corresponding to the frequency of the pulse width modulation signal and the sampling frequency, in a case in which the frequency of the pulse width modulation signal is denoted by Fn and the sampling frequency is denoted by Fs, the processor sets the frequency of the pulse width modulation signal to satisfy $NFs+Fs/4 \leq Fn \leq (N+1)Fs-Fs/4$, and N is an integer of 0 or more.

(3)

The electronic apparatus according to (2), in which the processor sets the frequency of the pulse width modulation signal to satisfy $Fn=NFs-Fs/4$ or $Fn=NFs+Fs/4$, and N is an integer of 1 or more.

(4)

The electronic apparatus according to any one of (1) to (3), in which the first electronic circuit outputs a plurality of pulse width modulation signals, and the processor performs control of setting frequencies of the plurality of pulse width modulation signals to the same frequency and shifting phases of the plurality of pulse width modulation signals.

(5)

The electronic apparatus according to (4), in which the first electronic circuit outputs n pulse width modulation signals, n is an integer of 2 or more, and the processor performs control of setting frequencies of the n pulse width modulation signals to the same frequency and shifting phases of the n pulse width modulation signals by 360/n degrees.

(6)

The electronic apparatus according to (4) or (5), in which the plurality of pulse width modulation signals include a plurality of pulse width modulation signal groups divided according to a duty ratio, and the processor performs control of shifting the phase of the pulse width modulation signal included in the pulse width modulation signal group for each of the pulse width modulation signal groups.

(7)

The electronic apparatus according to any one of (1) to (6), in which a ground of the low-pass filter circuit and a ground of the third electronic circuit are electrically connected to each other.

(8)

The electronic apparatus according to any one of (1) to (7), in which the second electronic circuit includes a sensor having at least a function of detecting a position of an object, and the analog signal is a signal indicating a detection result of the sensor.

(9)

The electronic apparatus according to (8), in which the second electronic circuit includes a constant current circuit that supplies a constant current to the sensor by using the output voltage of the low-pass filter circuit.

(10)

The electronic apparatus according to any one of (1) to (9), in which the second electronic circuit includes an amplification circuit that amplifies a signal indicating a detection result of a sensor having at least a function of detecting a position of an object by using the output voltage of the low-pass filter circuit, and the analog signal is a signal amplified by the amplification circuit.

(11)

The electronic apparatus according to any one of (1) to (10), in which the analog signal is a signal having a frequency equal to or less than ¼ of the sampling frequency as a usage band.

According to the present invention, it is possible to provide an electronic apparatus capable of reducing an influence of a noise from a PWM signal.

BRIEF DESCRIPTION OF THE DRAWINGS

FIG. 24 is a diagram showing a digital camera 300 as an example of the electronic apparatuses 100A and 100B.

DESCRIPTION OF THE PREFERRED EMBODIMENTS

Figure 1:
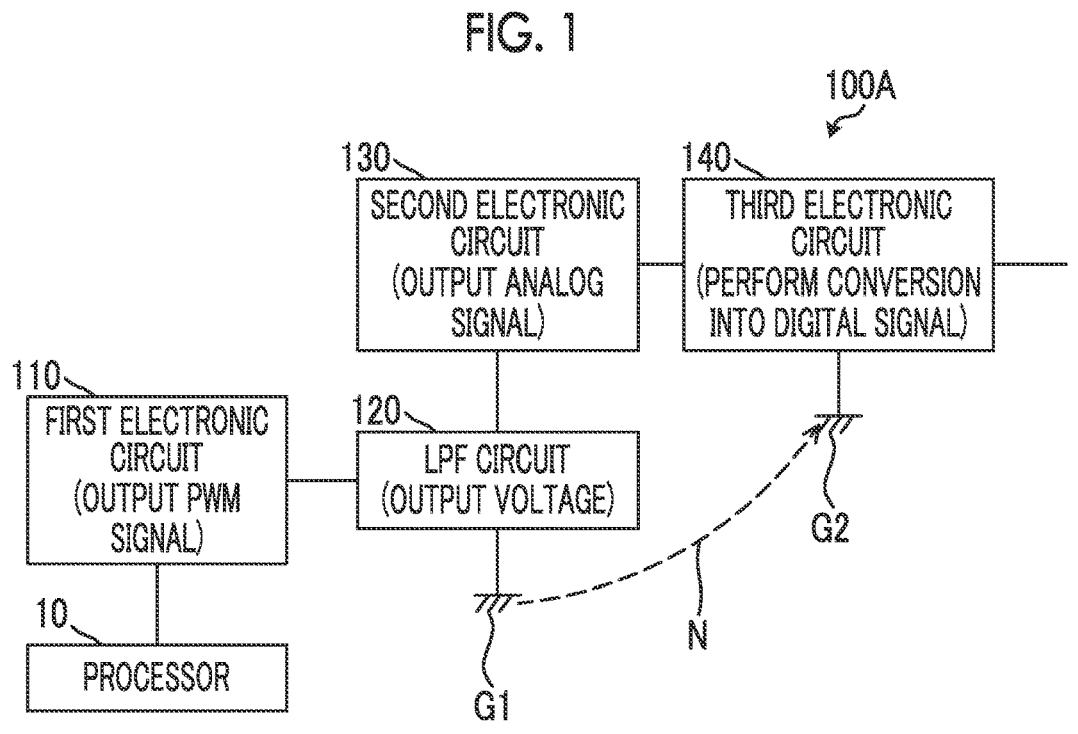
FIG. 1 is a block configuration diagram showing an example of an electronic apparatus 100A according to a first embodiment.

Hereinafter, an example of an embodiment of the present invention will be described with reference to the drawings. Electronic Apparatus According to First Embodiment FIG. 1 is a block configuration diagram showing an example of an electronic apparatus 100A according to a first embodiment. As an example, as shown in FIG. 1, the electronic apparatus 100A comprises a first electronic circuit 110, a low pass filter (LPF) circuit 120, a second electronic circuit 130, a third electronic circuit 140, and a processor 10. The electronic apparatus 100A is, for example, a camera, a sensor circuit device mounted in the camera.

The first electronic circuit 110 is a PWM signal generation circuit that outputs a pulse width modulation (PWM) signal.

The LPF circuit 120 is a circuit that outputs a voltage based on the pulse width modulation signal output from the first electronic circuit 110. The voltage based on the pulse width modulation signal is a voltage corresponding to a duty ratio of the pulse width modulation signal.

The second electronic circuit 130 is a circuit that outputs an analog signal by using the voltage output from the LPF circuit 120. The second electronic circuit 130 includes, for example, a sensor having at least a function of detecting a position of an object. Specific examples of the sensor include a hall sensor (a hall element, a magnetic sensor). The analog signal output from the second electronic circuit 130 is a signal indicating a detection result of the sensor. In addition, the second electronic circuit 130 includes a constant current circuit capable of supplying a constant current to a sensor (for example, a hall sensor) by using an output voltage of the LPF circuit 120. In addition, the second electronic circuit 130 includes an amplification circuit that amplifies a signal indicating a detection result of a sensor (for example, a hall sensor) by using the output voltage of the LPF circuit 120. In this case, the analog signal output from the second electronic circuit 130 is a signal amplified by the amplification circuit.

The third electronic circuit 140 is an analog/digital (A/D) converter that converts the analog signal output from the second electronic circuit 130 into a digital signal.

The processor 10 is, for example, a central processing unit (CPU) that controls the overall operation of the electronic apparatus 100A. The processor 10 sets, for example, a frequency Fn of the pulse width modulation signal output from the first electronic circuit 110 to a frequency Fn at which a noise component included in the digital signal output from the third electronic circuit 140 is reduced in relation to a sampling frequency Fs of the third electronic circuit 140. The noise component included in the digital signal is generated at a frequency corresponding to the frequency Fn of the pulse width modulation signal and the sampling frequency Fs.

In addition, the processor 10 sets the frequency Fn of the pulse width modulation signal to a frequency that satisfies Equation (1). Note that N is an integer of 0 or more.

$$NF_s + F_s/4 \leq Fn \leq (N+1)F_s - F_s/4 \tag{1}$$

For example, in a case in which the duty ratio of the pulse width modulation signal is close to 50%, the processor 10 sets Fn to a frequency satisfying Equation (1).

In addition, the processor 10 sets the frequency Fn of the pulse width modulation signal to a frequency that satisfies Equation (2). Note that N is an integer of 1 or more.

$$Fn = NF_s - F_s/4 \text{ or } Fn = NF_s + F_s/4 \tag{2}$$

For example, in a case in which the duty ratio of the pulse width modulation signal is close to 30% and in a case in which the duty ratio of the pulse width modulation signal is close to 50%, the processor 10 sets Fn to a frequency satisfying Equation (2). The term "satisfying Equation (2)"

includes not only a case of "completely satisfying Equation (2)" but also a case of "substantially satisfying Equation (2)".

A ground G1 of the LPF circuit 120 and a ground G2 of the third electronic circuit 140 are electrically connected to each other due to difficulty in ground separation or the like. Therefore, a noise N caused by a PWM waveform generated from the first electronic circuit 110 can be superimposed on the third electronic circuit 140 via the ground.

The analog signal output from the second electronic circuit 130 and input to the third electronic circuit 140 is a signal having a frequency equal to or less than ¼ of the sampling frequency Fs as a usage band. The term "usage band" is a band including signal information (for example, a change in the position of an object). Specifically, the term "usage band" is a frequency band necessary for a signal of the third electronic circuit 140 (AD converter), for example, a frequency band necessary for detecting an angular velocity of a shake of a camera generated by a camera shake, or the like.

Figure 2:
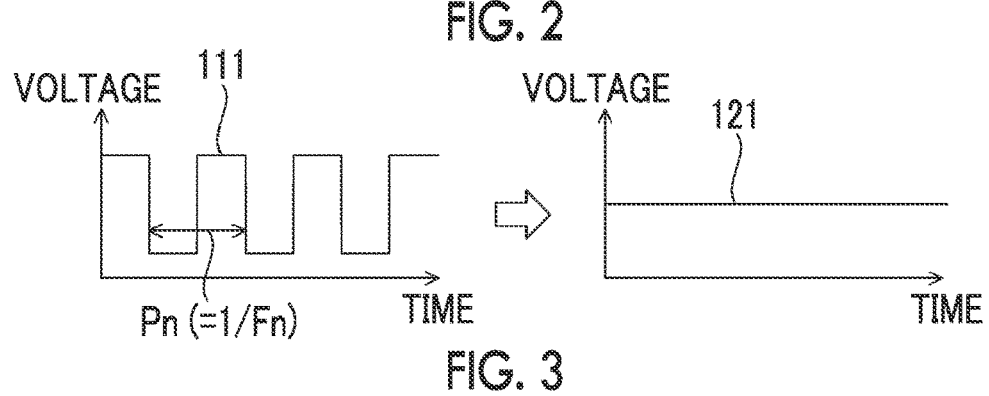
FIG. 2 is a diagram showing a PWM signal output from a first electronic circuit 110 and a voltage output from an LPF circuit 120.

FIG. 2 is a diagram showing the PWM signal output from the first electronic circuit 110 and the voltage output from the LPF circuit 120. A PWM signal 111 output from the first electronic circuit 110 is input to the LPF circuit 120, and is output from the LPF circuit 120 as an analog voltage 121. Assuming that a period of the PWM signal is a PWM period Pn and a frequency of the PWM signal is a PWM frequency Fn, the processor 10 sets the frequency Fn of the PWM signal 111 to a frequency satisfying Equation (1) or (2).

Figure 3:
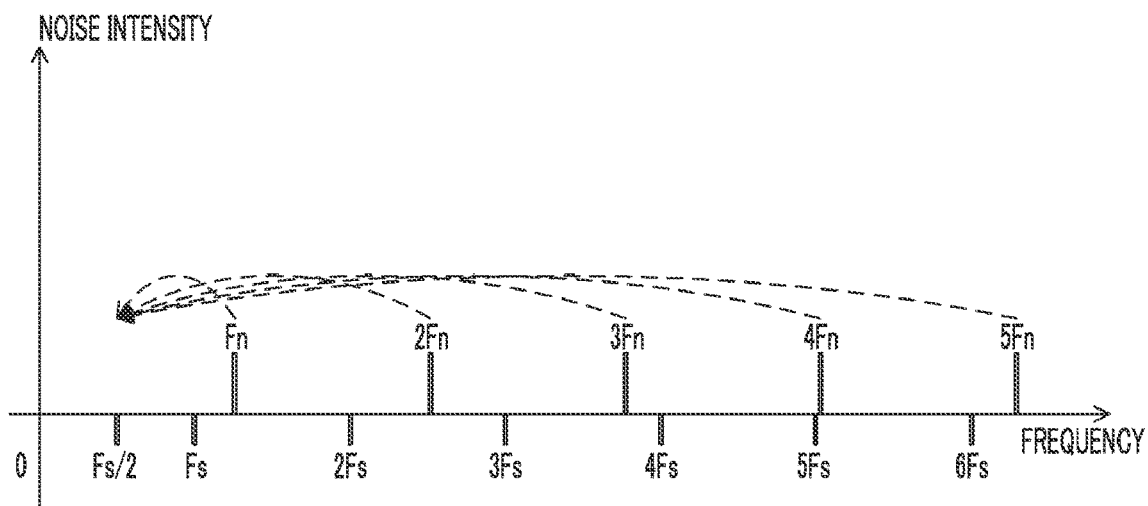
FIG. 3 is a diagram showing noises generated due to a PWM signal 111.

FIG. 3 is a diagram showing noises generated due to the PWM signal 111 output from the first electronic circuit 110. The PWM signal 111 is a composite wave formed by combining waveforms of integral multiples of the PWM frequency Fn (a waveform of the frequency Fn, a waveform of a frequency 2Fn which is two times the frequency Fn, a waveform of a frequency 3Fn which is three times the frequency Fn, . . . ). Therefore, the noise generated from the first electronic circuit 110 includes a noise of the frequency Fn corresponding to the frequency of the PWM composite wave and a noise of the frequency (2Fn, 3Fn, . . . ) that is an integral multiple of the frequency Fn.

The noises of the frequencies Fn, 2Fn, 3Fn, . . . , are superimposed on the third electronic circuit 140 (AD converter) via the ground (ground G1 to ground G2) as described above. Therefore, in a case in which the AD converter performs AD conversion processing at, for example, the sampling frequency Fs, a noise of a frequency exceeding a Nyquist frequency Fs/2 among the noises superimposed on the AD converter is mixed into the digital signal converted by the AD converter after aliasing as an aliasing noise.

Figure 4:
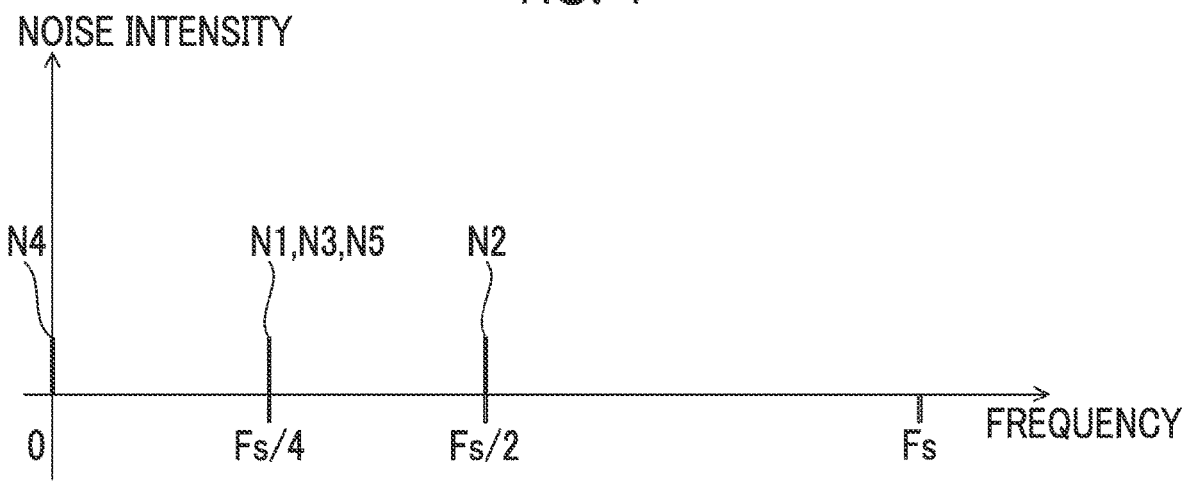
FIG. 4 is a diagram showing an example of an aliasing noise observed in an output signal of a third electronic circuit 140.

FIG. 4 is a diagram showing a frequency of an aliasing noise observed in the output signal (digital signal) of the AD converter after the AD conversion by the AD converter (third electronic circuit 140). As shown in FIG. 4, among the noises of the frequencies Fn, 2Fn, 3Fn, 4Fn, and 5Fn (see FIG. 3) superimposed on the AD converter, for example, an aliasing noise N2 due to the noise of the frequency 2Fn which is two times the frequency Fn appears in the output signal of the AD converter as a noise of the frequency Fs/2. Similarly, aliasing noises N1, N3, and N5 due to the noise of the frequency Fn which is one time the frequency Fn, the noise of the frequency 3Fn which is three times the frequency Fn, and the noise of the frequency 5Fn which is five times the frequency Fn appear in the output signal of the AD converter as a noise of the frequency Fs/4. Similarly, an aliasing noise N4 due to the noise of the frequency 4Fn which is four times the frequency Fn appears in the output signal of the AD converter as noise of a frequency 0.

Incidentally, the analog signal output from the second electronic circuit 130 and input to the third electronic circuit 140 (AD converter) is a signal having a frequency equal to or less than ¼ of the sampling frequency Fs as a usage band as described above. Therefore, it is desirable that, in the output signal of the AD converter, no aliasing noise with a high intensity appears in a band of a frequency Fs/4 or less.

Figure 5:
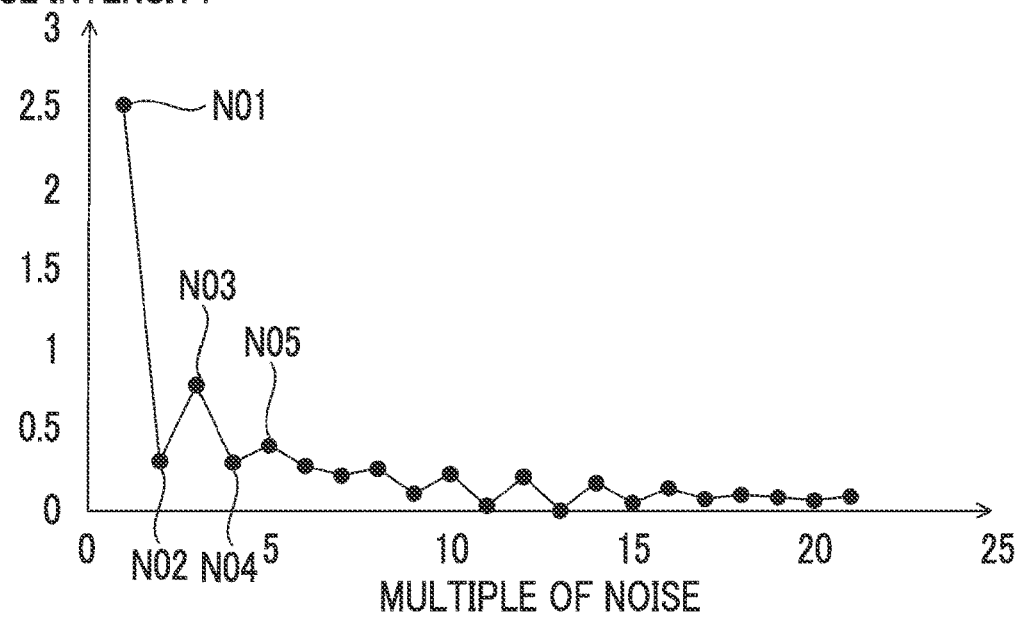
FIG. 5 is a diagram showing a result of Fourier analysis of a PWM signal having a duty ratio of around 50%.

Therefore, first, Fourier analysis of the PWM signal was performed in order to detect what kind of frequency noise component is included in the PWM signal. FIG. 5 is a diagram showing a result of Fourier analysis of a PWM signal having a duty ratio of around 50%. As shown in FIG. 5, in a case of a PWM signal having a duty ratio of around 50%, an intensity of a first harmonic noise N01, which is a noise having the same frequency as the frequency Fn among the included noise components, is high, and an intensity of a second harmonic noise N02, which is a noise having a frequency which is two times the frequency Fn, is low. In addition, a third harmonic noise N03 has a slightly higher intensity than the second harmonic noise N02, but has a lower intensity than the noise intensity 1. Further, a fourth harmonic noise N04, a fifth harmonic noise N05, and noises of multiples higher than that have an intensity lower than the noise intensity 0.5, as with the second harmonic noise N02. From this result, in a case in which the duty ratio of the PWM signal is around 50%, it is required that an aliasing noise of the first harmonic noise N01 does not appear in the band of the frequency Fs/4 or less in the output signal of the AD converter.

Therefore, next, a study was made to prevent the aliasing noise of the first harmonic noise N01 from appearing in the band of the frequency Fs/4 or less in the output signal of the AD converter in relation between the frequency Fn of the PWM signal and the sampling frequency Fs of the AD converter. Then, as a result of the study, it was found that by setting the frequency Fn of the PWM signal to satisfy Equation (1), the aliasing noise of the first harmonic noise N01 does not appear in the band of the frequency Fs/4 or less in the output signal of the AD converter. Note that N is an integer of 0 or more.

Figure 6:
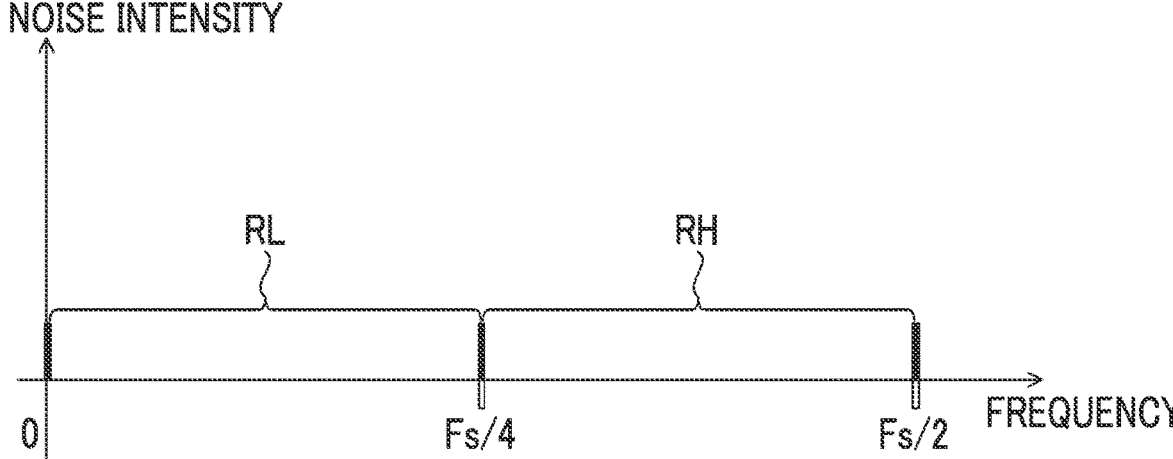
FIG. 6 is a diagram showing an example of an aliasing noise observed in an output signal of the third electronic circuit 140.

FIG. 6 is a diagram showing a frequency of an aliasing noise observed in the output signal of the AD converter in a case in which the frequency Fn of the PWM signal is set to satisfy Equation (1). By setting the frequency Fn of the PWM signal to satisfy Equation (1), the aliasing noise N1 of the first harmonic noise N01 with a high intensity can be made to appear in a range RH from the frequency Fs/4 to the frequency Fs/2 shown in FIG. 6. In addition, the aliasing noise N2 of the second harmonic noise N02 with a low intensity can be made to appear in a range RL of the frequency Fs/4 or less.

Figure 7:
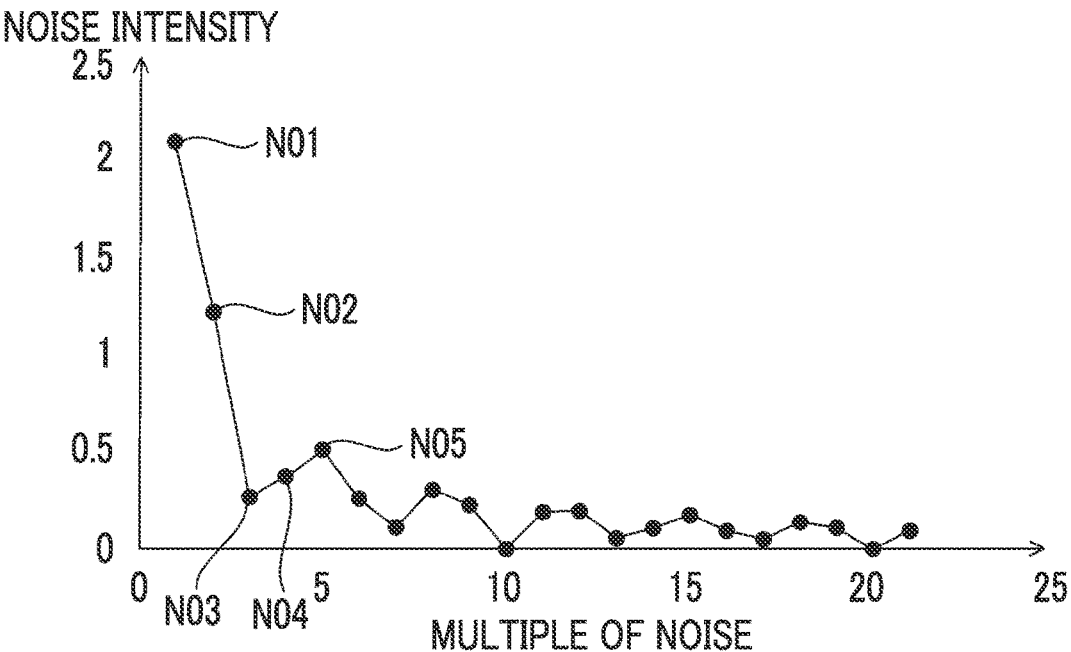
FIG. 7 is a diagram showing a result of Fourier analysis of a PWM signal having a duty ratio of around 30%.

Next, Fourier analysis of the PWM signal was performed in order to detect what kind of frequency noise component is included in the PWM signal having another duty ratio. FIG. 7 is a diagram showing a result of Fourier analysis of a PWM signal having a duty ratio of around 30%. As shown in FIG. 7, in a case of a PWM signal having a duty ratio of around 30%, not only a first harmonic noise N01, which is a noise having the same frequency as the frequency Fn among the included noise components, is high, but also a second harmonic noise N02, which is a noise having a frequency which is two times the frequency Fn, has a high intensity. In addition, a third harmonic noise N03, a fourth harmonic noise N04, a fifth harmonic noise N05, and noises of multiples higher than that have an intensity lower than the noise intensity 0.5. From this result, in a case in which the duty ratio of the PWM signal is around 30%, it is required that an aliasing noise of the first harmonic noise N01 and an aliasing noise of the second harmonic noise N02 do not appear in the band of the frequency Fs/4 or less in the output signal of the AD converter.

Therefore, next, a study was made to prevent the aliasing noise of the first harmonic noise N01 and the aliasing noise of the second harmonic noise N02 from appearing in the band of the frequency Fs/4 or less in the output signal of the AD converter in relation between the frequency Fn of the PWM signal and the sampling frequency Fs of the AD converter. Then, as a result of the study, it was found that by setting the frequency Fn of the PWM signal to satisfy Equation (2), the aliasing noise of the first harmonic noise N01 and the aliasing noise of the second harmonic noise N02 do not appear in the band of the frequency Fs/4 or less in the output signal of the AD converter. Note that N is an integer of 1 or more.

Figure 8:
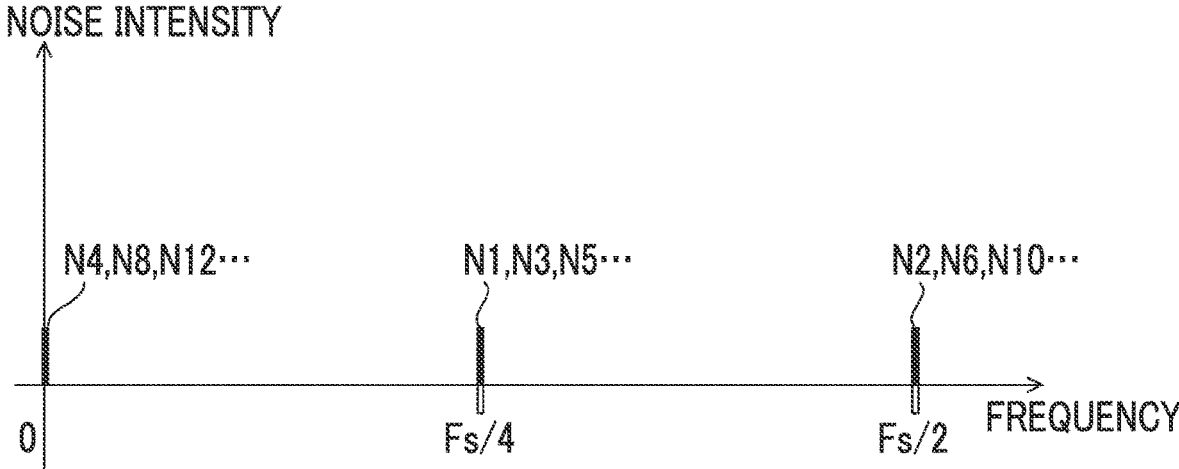
FIG. 8 is a diagram showing an example of an aliasing noise observed in an output signal of the third electronic circuit 140.

FIG. 8 is a diagram showing a frequency of an aliasing noise observed in the output signal of the AD converter in a case in which the frequency Fn of the PWM signal is set to satisfy Equation (2). By setting the frequency Fn of the PWM signal to satisfy Equation (2), the aliasing noise N1 of the first harmonic noise N01 (see FIG. 7) with a high intensity and the aliasing noises N3, N5, ..., can be made to appear at the frequency Fs/4 shown in FIG. 8. In addition, the aliasing noise N2 of the second harmonic noise N02 (see FIG. 7) with a high intensity and the aliasing noises N6, N10, ..., can be made to appear at the frequency Fs/2. Then, the aliasing noise N4 of the fourth harmonic noise N04 with a low intensity and the aliasing noises N8, N12, ..., can be made to appear at the frequency 0.

As described above, in the electronic apparatus 100A according to the first embodiment, the frequency Fn of the PWM signal output from the first electronic circuit 110 is set to satisfy $NFs+Fs/4 \leq Fn \leq (N+1)Fs-Fs/4$ in relation to the sampling frequency Fs of the third electronic circuit 140. Accordingly, it is possible to prevent the aliasing noise N1 with a high noise intensity from appearing in the frequency band equal to or less than ¼ of the sampling frequency Fs.

In addition, in the electronic apparatus 100A, the frequency Fn of the PWM signal output from the first electronic circuit 110 is set to satisfy $Fn=NFs-Fs/4$ or $Fn=NFs+Fs/4$ in relation to the sampling frequency Fs of the third electronic circuit 140. Accordingly, it is possible to prevent the aliasing noises N1 and N2 with a high noise intensity from appearing in the frequency band less than ¼ of the sampling frequency Fs. In addition, since the aliasing noises N1, N3, and N5 of the odd harmonics with a high noise intensity can be made to appear at the frequency Fs/4, it is possible to reduce the influence of these noises by, for example, single notch filter processing.

Electronic Apparatus According to Second Embodiment

Figure 9:
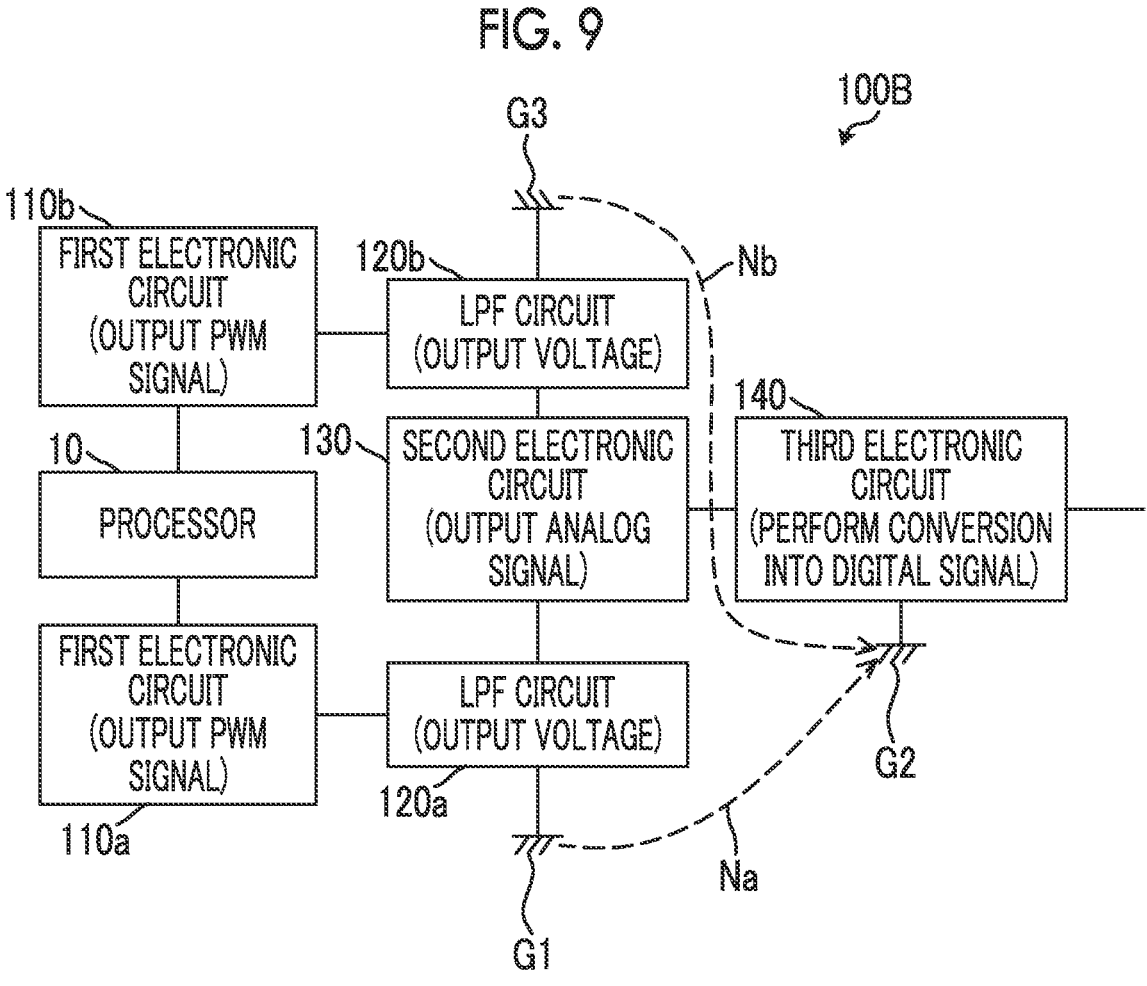
FIG. 9 is a block configuration diagram showing an example of an electronic apparatus 100B according to a second embodiment.

FIG. 9 is a block configuration diagram showing an example of an electronic apparatus 100B according to a second embodiment. As an example, as shown in FIG. 9, the electronic apparatus 100B comprises a plurality of (two in this example) first electronic circuits 110a and 110b, LPF circuits 120a and 120b respectively connected to the first electronic circuits 110a and 110b, a second electronic circuit 130, a third electronic circuit 140, and a processor 10.

The first electronic circuit may be one first electronic circuit capable of outputting two PWM signals instead of the two first electronic circuits 110a and 110b. In addition, the second electronic circuit may be two second electronic circuits instead of one second electronic circuit 130, and outputs of the LPF circuits 120a and 120b may be input to the second electronic circuits, respectively. In this case, the third electronic circuit 140 may be divided into, for example, two third electronic circuits 140a and 140b.

In the case of this example, a ground G1 of the LPF circuit 120a and a ground G2 of the third electronic circuit 140 are electrically connected to each other, and a ground G3 of the LPF circuit 120b and the ground G2 of the third electronic circuit 140 are electrically connected to each other. Therefore, a noise Na caused by a PWM waveform generated from the first electronic circuit 110a can be superimposed on the third electronic circuit 140 via the grounds G1 and G2, and a noise Nb caused by a PWM waveform generated from the first electronic circuit 110b can be superimposed on the third electronic circuit 140 via the grounds G3 and G2.

Therefore, as in the first embodiment, it is required that a noise signal with a high intensity is not superimposed on the output signal of the third electronic circuit 140 (AD converter) in the same frequency band as a usage band of an analog signal input to the third electronic circuit 140. Therefore, a study was made regarding reduction of the noise signal superimposed on the output signal of the AD converter in relation between the noise Na superimposed on the third electronic circuit 140 via the grounds G1 and G2 and the noise Nb superimposed on the third electronic circuit 140 via the grounds G3 and G2.

Then, as a result of the study, it was found that in a case in which the first electronic circuit outputs n PWM signals (n is an integer of 2 or more), the noise signal superimposed on the output signal of the third electronic circuit 140 can be reduced by setting frequencies of the n PWM signals to the same frequency and shifting phases of the n PWM signals by 360/n degrees. The term "same frequency" includes a frequency difference caused by an individual difference in electronic circuits on a substrate, a wiring line, or the like.

Figure 10:
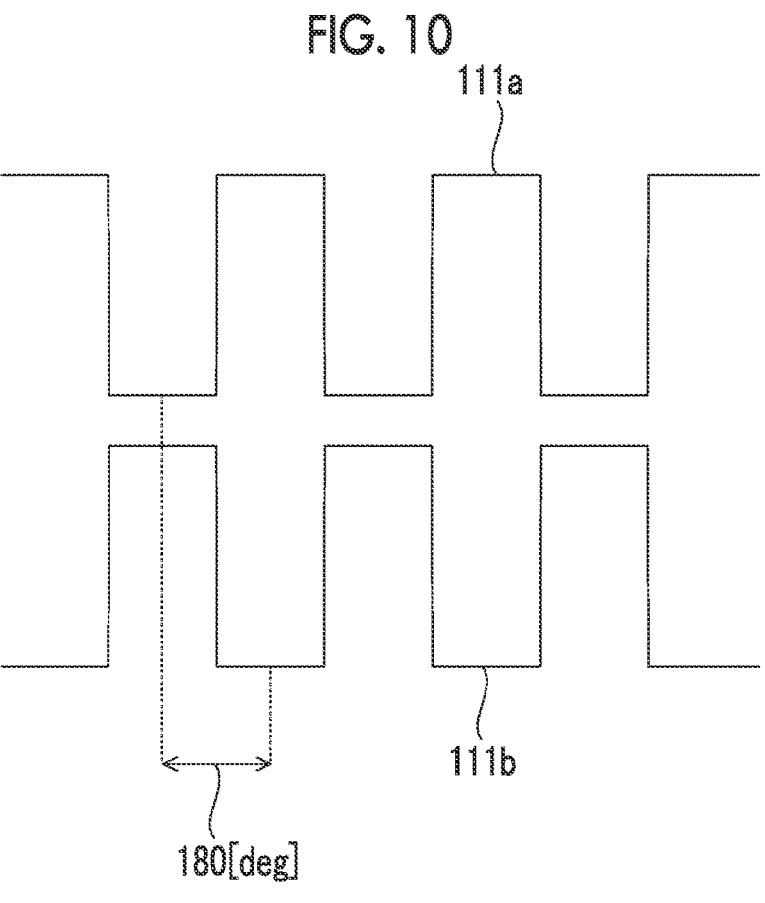
FIG. 10 is a diagram showing phase adjustment of two PWM signals 111a and 111b.

FIG. 10 is a diagram showing an example of a PWM signal 111a output from the first electronic circuit 110a and a PWM signal 111b output from the first electronic circuit 110b in the electronic apparatus 100B having the configuration shown in FIG. 9. As shown in FIG. 10, in a case in which two PWM signals (PWM signals 111a and 111b) are output, the processor 10 sets frequencies of the PWM signal 111a and the PWM signal 111b to the same frequency, and shifts phases of both signals by 180 degrees. In the case of this example, the PWM signals 111a and 111b having the same duty ratio (substantially 50%) are shown.

Figure 11:
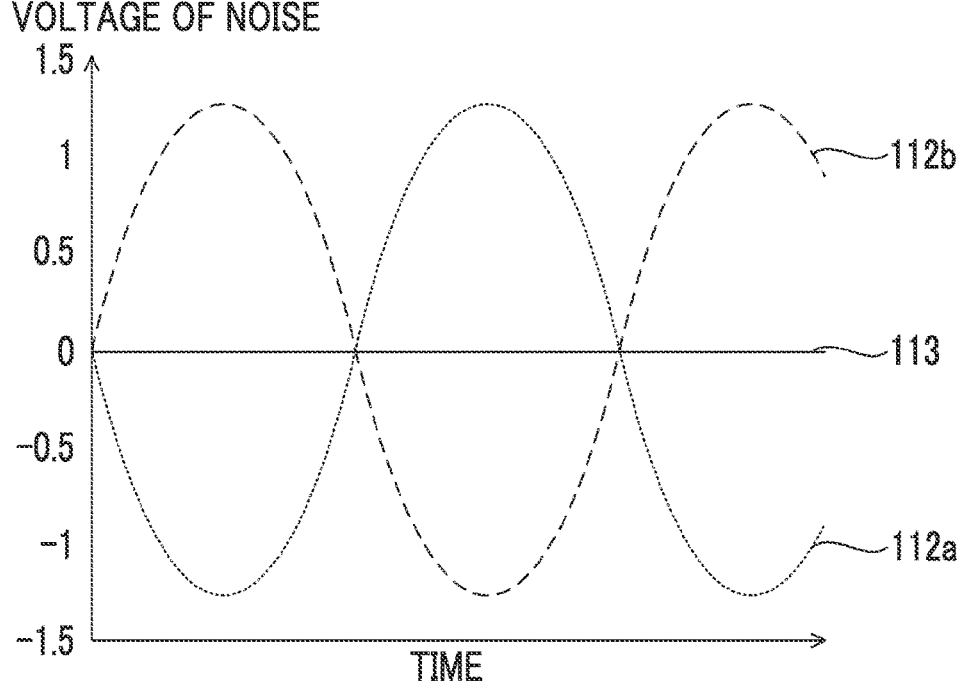
FIG. 11 is a diagram showing an effect of noise reduction by the electronic apparatus 100B.

FIG. 11 is a diagram showing an effect of noise reduction in a case in which the frequencies of the PWM signal 111a and the PWM signal 111b are set to the same frequency and the phases thereof are shifted by 180 degrees as in FIG. 10. As shown in FIG. 11, a voltage waveform 112a of the noise Na superimposed on the third electronic circuit 140 via the grounds G1 and G2 and a voltage waveform 112b of the noise Nb superimposed on the third electronic circuit 140 via the grounds G3 and G2 cancel each other with shifted phases by 180 degrees. As a result, the noise superimposed on the output signal of the AD converter is reduced to substantially 0 (zero) noise as shown in a voltage waveform 113.

Case in which PWM Signal of n=3 is Output

A case where the electronic apparatus 100B shown in FIG. 9 comprises the first electronic circuits 110a and 110b with n=2 has been described, but, for example, the electronic apparatus 100B may have a configuration comprising the first electronic circuit with n=3. In this case, LPF circuits 120a, 120b, and 120c respectively connected to three first electronic circuits 110a, 110b, and 110c are provided.

Figure 12:
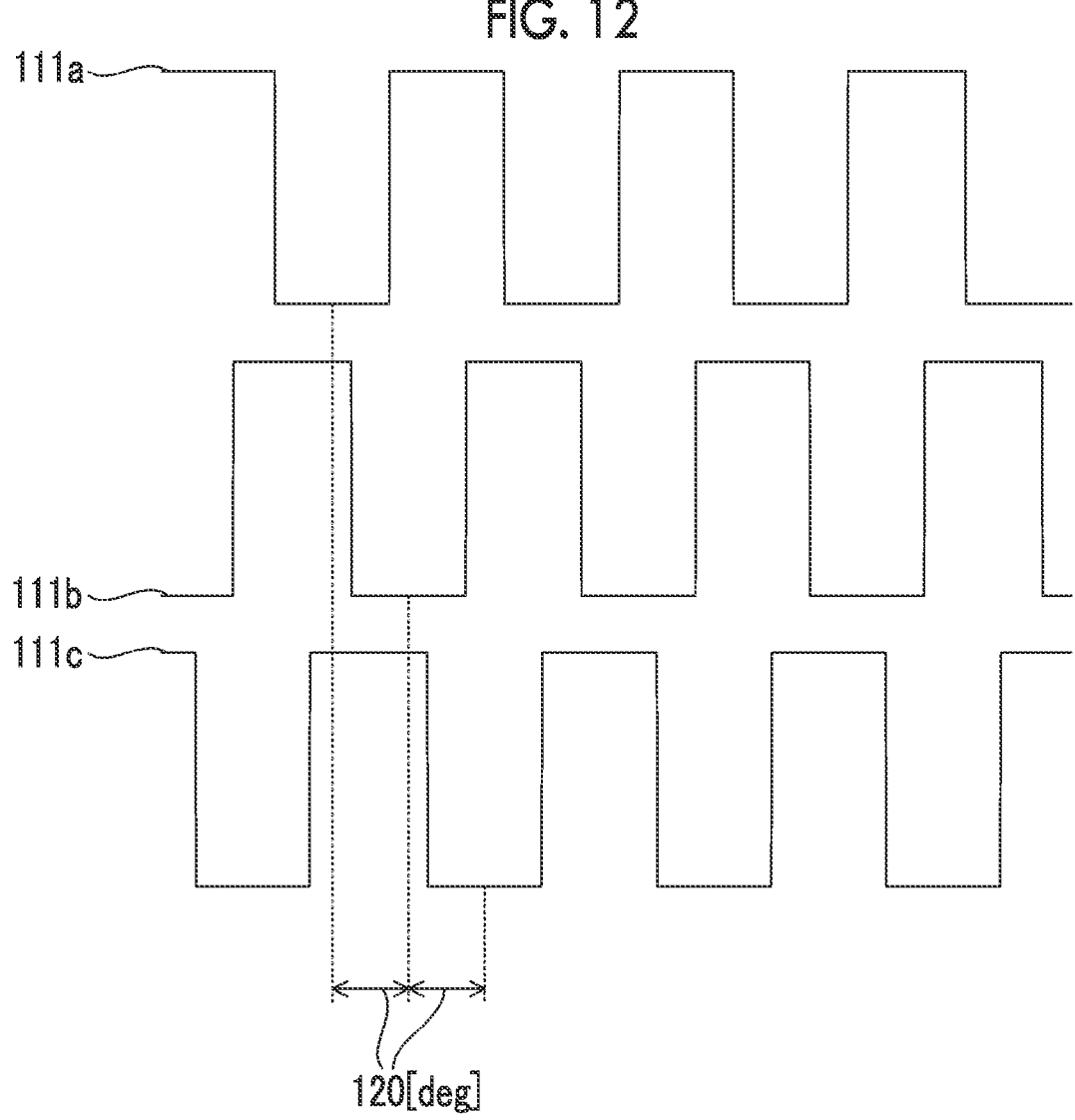
FIG. 12 is a diagram showing phase adjustment of three PWM signals 111a, 111b, and 111c.

FIG. 12 is a diagram showing an example of PWM signals 111*a*, 111*b*, and 111*c* output from three first electronic circuits (for example, the first electronic circuits 110*a*, 110*b*, and 110*c*), respectively. As shown in FIG. 12, in a case in which PWM signals with n=3 (PWM signals 111*a*, 111*b*, and 111*c*) are output, the processor 10 sets frequencies of the PWM signal 111*a*, the PWM signal 111*b*, and the PWM signal 111*c* to the same frequency, and shifts phases of the PWM signal 111*a* and the PWM signal 111*b* by 120 degrees (360/n) and shifts phases of the PWM signal 111*b* and the PWM signal 111*c* by 120 degrees. In the case of this example, the PWM signals 111*a*, 111*b*, and 111*c* having the same duty ratio (substantially 50%) are shown.

Case in which Four or More PWM Signals are Output

Although not shown, for example, in a case in which four first electronic circuits are provided and PWM signals with n=4 are output, the phase to be shifted is 360/4=90 degrees, and in a case in which five first electronic circuits are provided and PWM signals with n=5 are output, the phase to be shifted is 360/5=72 degrees.

Case in which Duty Ratios of PWM Signals are Different

Next, phase adjustment of the PWM signal in a case in which the duty ratio is different between the PWM signals output from a plurality of the first electronic circuits 110 will be described with reference to FIGS. 13 to 16. In addition, FIGS. 13 to 16 describe a case in which the electronic apparatus 100B comprises the first electronic circuits 110*a* and 110*b* with n=2. In addition, it is assumed that the duty ratio of the PWM signal 111*a* output from the first electronic circuit 110*a* is approximately 50%, and the duty ratio of the PWM signal 111*b* output from the first electronic circuit 110*b* is approximately 60%.

Figures 13, 14:
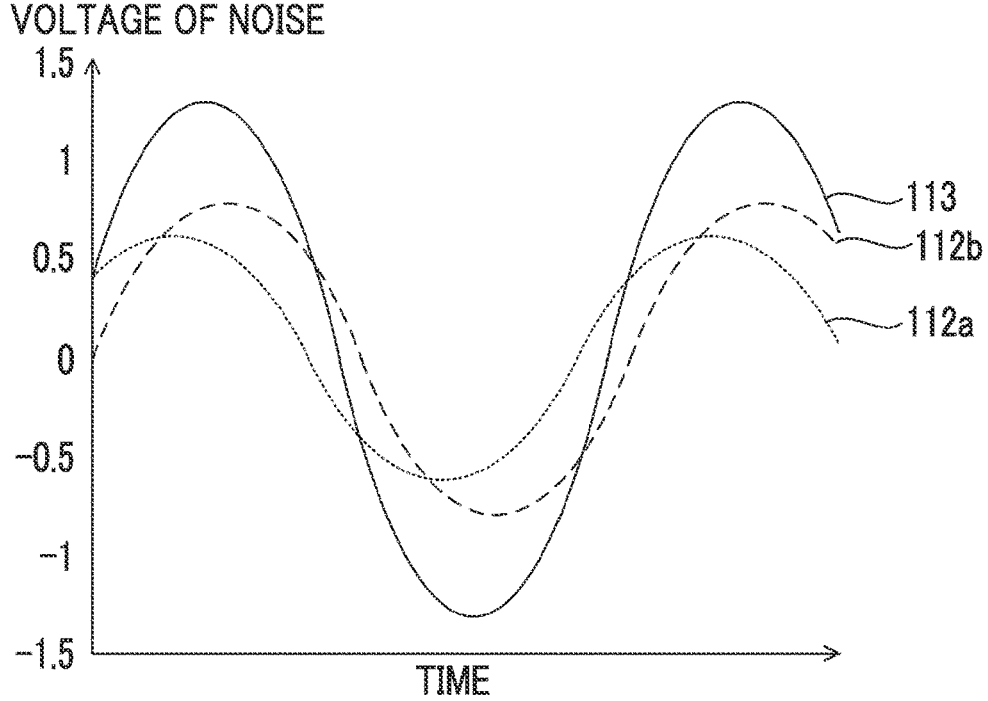
FIG. 13 is a diagram showing a reference example of adjusting a phase of a PWM signal with respect to an edge portion.
FIG. 14 is a diagram showing an effect of noise reduction according to the reference example of FIG. 13.

FIG. 13 is a diagram showing a reference example of a case in which the phase between the PWM signals is adjusted with respect to edge portions of the PWM signals. As shown in FIG. 13, in a case in which the duty ratios of the PWM signal 111*a* and the PWM signal 111*b* are different, the processor 10 sets frequencies of the PWM signal 111*a* and the PWM signal 111*b* to the same frequency, and shifts the phases of the PWM signals by 180 degrees with respect to edge portions (in this example, falling edges) of the PWM signal 111*a* and the PWM signal 111*b*.

FIG. 14 is a diagram showing an effect of noise reduction in a case in which the frequencies of the PWM signal 111*a* and the PWM signal 111*b* are set to the same frequency and the phases of the PWM signal 111*a* and the PWM signal 111*b* are shifted by 180 degrees with respect to the signal falling as in FIG. 13. As shown in FIG. 14, the voltage waveform 112*a* of the noise Na superimposed on the third electronic circuit 140 via the grounds G1 and G2 and the voltage waveform 112*b* of the noise Nb superimposed on the third electronic circuit 140 via the grounds G3 and G2 have a phase shift of 180 degrees between the PWM signals 111*a* and 111*b* with respect to the falling of both signals, so that an effect of making the noises cancel each other and reducing the noise is not maximized. As a result, a noise having a magnitude as shown in a voltage waveform 113 remains in the noise superimposed on the output signal of the AD converter. That is, in a case in which the phase between the PWM signals having different duty ratios is adjusted, the adjustment method of shifting the phase with respect to the edge portion of the PWM signal cannot be said to have a high effect of noise reduction and is not preferable.

Figure 15:
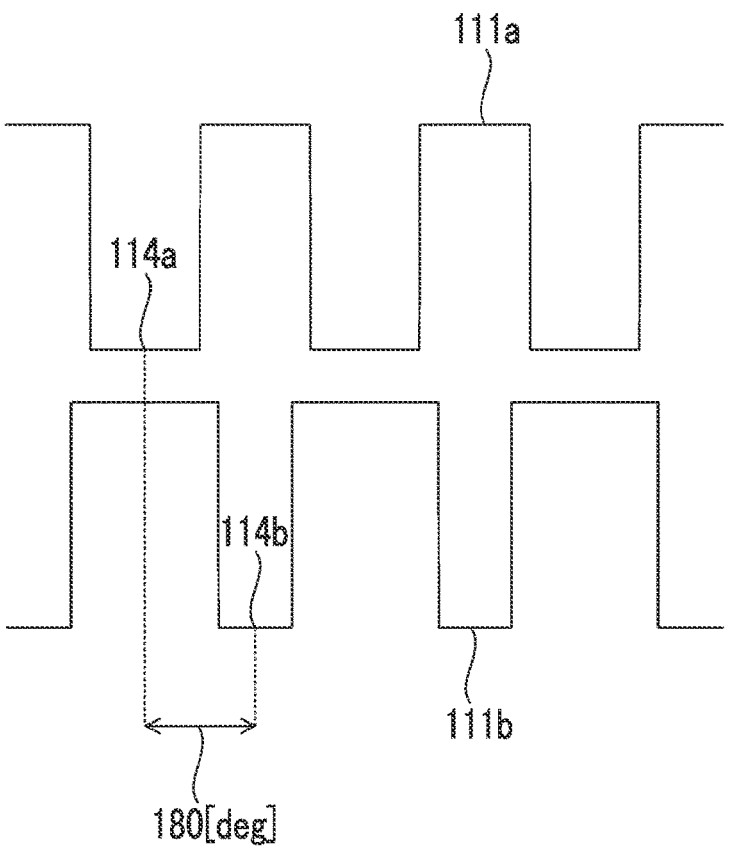
FIG. 15 is a diagram showing an example of adjusting a phase of a PWM signal with respect to a center of a falling section.

On the other hand, in the second embodiment, in a case in which the duty ratio is different between the PWM signals, the phase between the PWM signals is adjusted with respect to a center of a rising section or a center of a falling section of the PWM signal. FIG. 15 is a diagram showing an example of adjusting the phase between the PWM signals with respect to the center of the falling section of the PWM signal. As shown in FIG. 15, in a case in which the duty ratios of the PWM signal 111*a* and the PWM signal 111*b* are different, the processor 10 sets frequencies of the PWM signal 111*a* and the PWM signal 111*b* to the same frequency, and shifts the phase between the PWM signal 111*a* and the PWM signal 111*b* by 180 degrees with respect to a center 114*a* of a falling section of the PWM signal 111*a* and a center 114*b* of a falling section of the PWM signal 111*b*.

Figure 16:
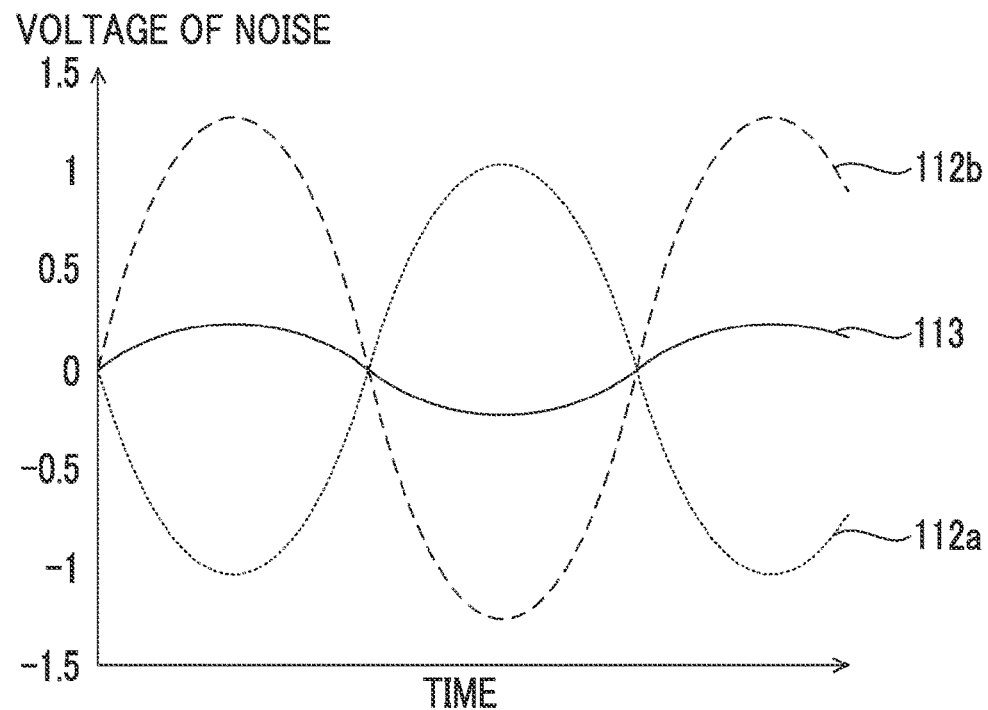
FIG. 16 is a diagram showing an effect of noise reduction according to the example of FIG. 15.

FIG. 16 is a diagram showing an effect of noise reduction in a case in which the PWM signal 111*a* and the PWM signal 111*b* are adjusted as in FIG. 15. As shown in FIG. 16, the voltage waveform 112*a* of the noise Na superimposed on the third electronic circuit 140 via the grounds G1 and G2 and the voltage waveform 112*b* of the noise Nb superimposed on the third electronic circuit 140 via the grounds G3 and G2 have a phase shift of 180 degrees between the PWM signals 111*a* and 111*b* with respect to the centers of the falling sections of both signals, so that an effect of making the noises cancel each other and reducing the noise is maximized. As a result, the noise superimposed on the output signal of the AD converter is reduced to a small noise as shown in a voltage waveform 113.

Case in which Plurality of PWM Signal Groups are Included

Next, a case in which a plurality of PWM signals are output and a plurality of PWM signal groups that can be classified according to the duty ratio are included in the PWM signals will be described with reference to FIGS. 17 and 18.

Figure 17:
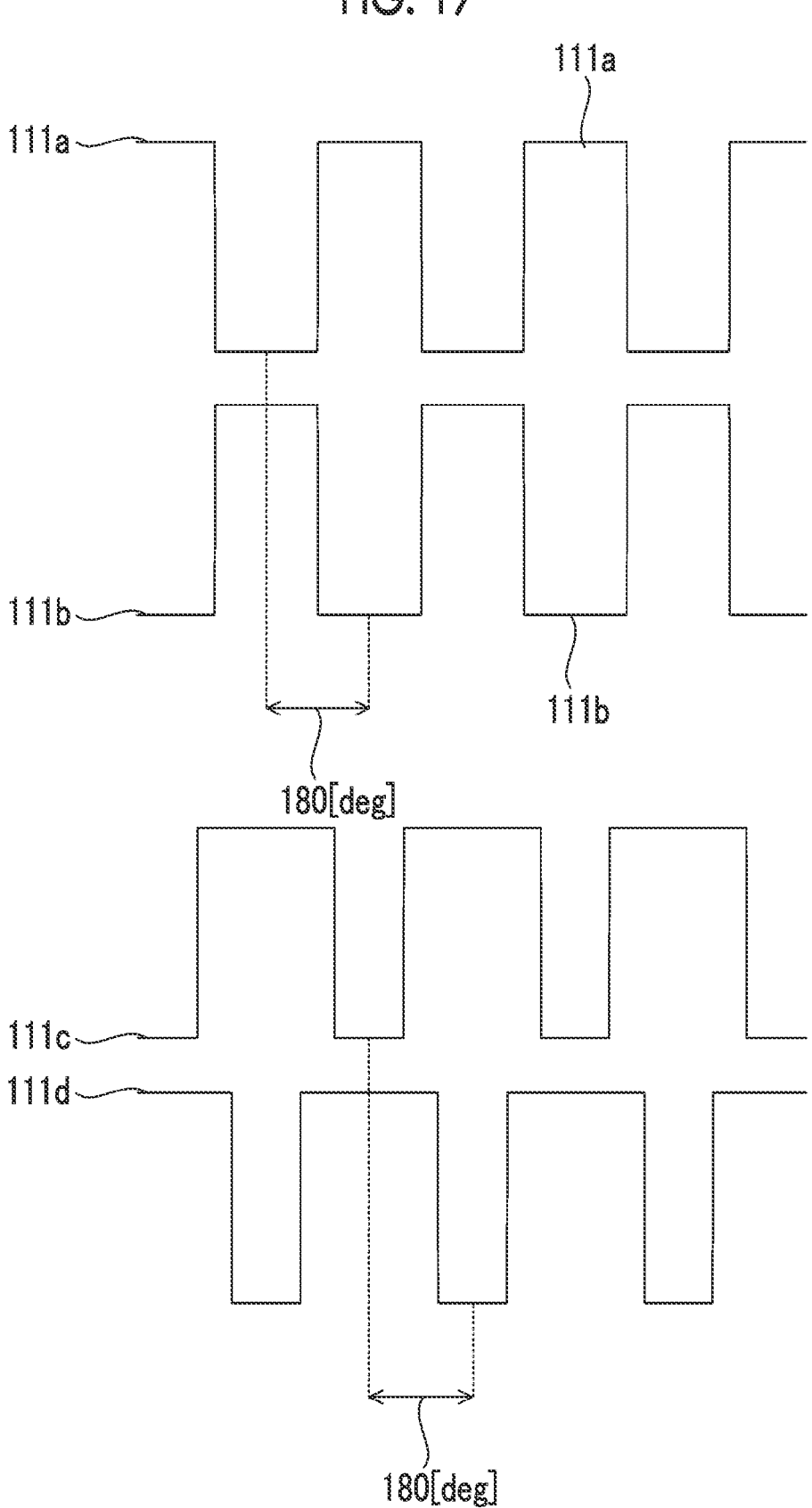
FIG. 17 is a diagram showing an example of adjusting a phase for PWM signals whose duty ratios are close to each other.

FIG. 17 is a diagram showing a case in which the electronic apparatus 100B comprises four first electronic circuits 110*a* to 110*d*, and a PWM signal group having a duty ratio of 50% and a PWM signal group having a duty ratio of 60% are included in the PWM signals output from the first electronic circuits 110*a* to 110*d*. As shown in FIG. 17, the PWM signal 111*a* output from the first electronic circuit 110*a* and the PWM signal 111*b* output from the first electronic circuit 110*b* constitute a PWM signal group having a duty ratio of 50%, and the PWM signal 111*c* output from the first electronic circuit 110*c* and the PWM signal 111*d* output from the first electronic circuit 110*d* constitute a PWM signal group having a duty ratio of 60%. The PWM signal group having a duty ratio of 50% and the PWM signal group having a duty ratio of 60% each include PWM signals with n=2.

In a case in which the plurality of PWM signals include a plurality of PWM signal groups divided according to the duty ratio, for example, in a case in which a PWM signal group having a duty ratio of 50% and a PWM signal group having a duty ratio of 60% are included, the processor 10 shifts the phases of the PWM signals included in the PWM signal group for each PWM signal group.

Specifically, the processor 10 sets frequencies of the PWM signal 111*a* and the PWM signal 111*b* included in the PWM signal group having a duty ratio of 50% to the same frequency, and shifts phases of both signals by 180 degrees. In addition, the processor 10 sets frequencies of the PWM signal 111*c* and the PWM signal 111*d* included in the PWM signal group having a duty ratio of 60% to the same frequency, and shifts phases of both signals by 180 degrees.

Figure 18:
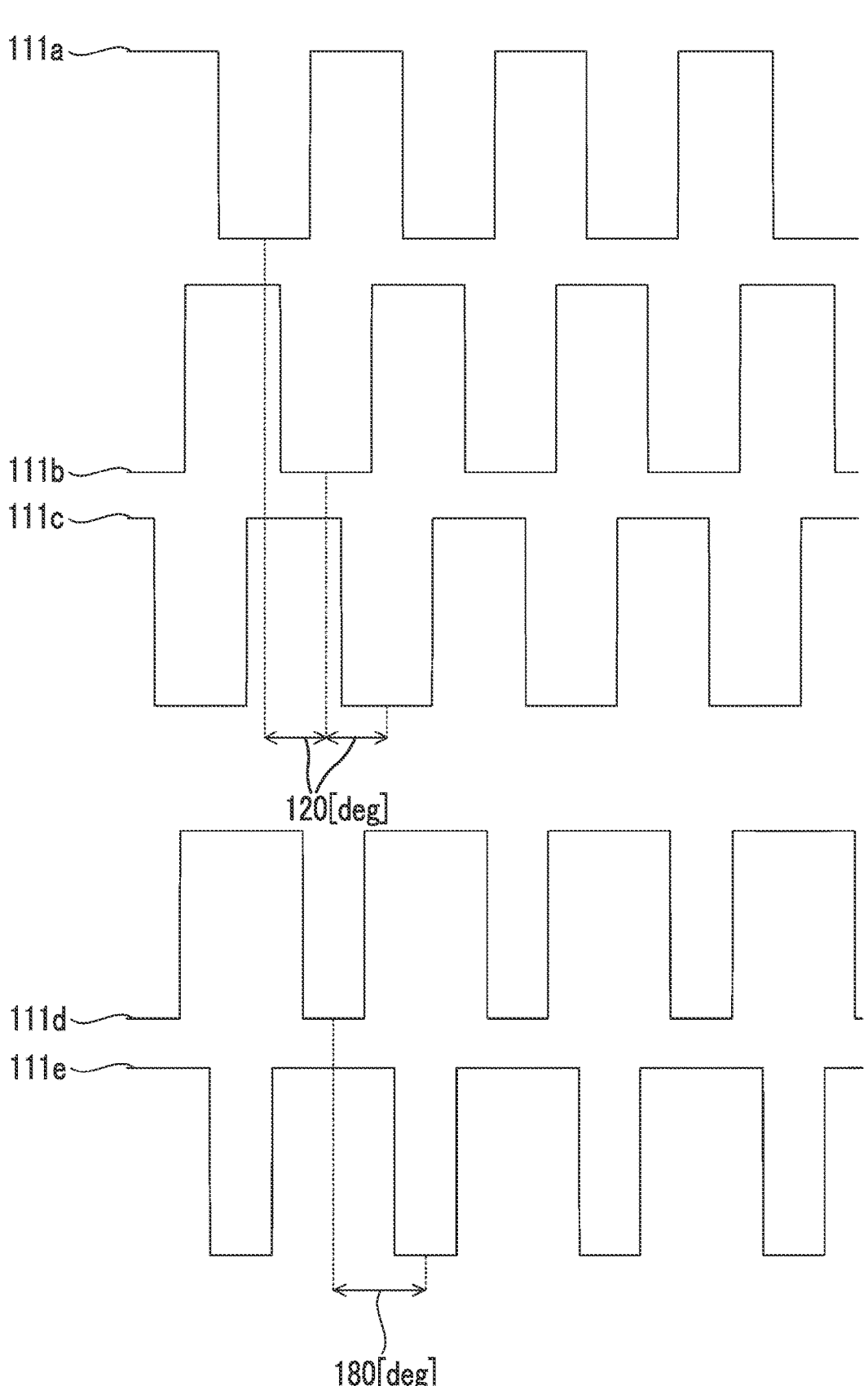
FIG. 18 is a diagram showing another example of adjusting a phase for PWM signals whose duty ratios are close to each other.

FIG. 18 is a diagram showing a case in which the electronic apparatus 100B comprises five first electronic circuits 110*a* to 110*e*, and a PWM signal group having a duty ratio of 50% and a PWM signal group having a duty ratio of 60% are included in the PWM signals output from the first electronic circuits 110a to 110e. As shown in FIG. 18, the PWM signal 111a output from the first electronic circuit 110a, the PWM signal 111b output from the first electronic circuit 110b, and the PWM signal 111c output from the first electronic circuit 110c constitute a PWM signal group having a duty ratio of 50%, and the PWM signal 111d output from the first electronic circuit 110d and the PWM signal 111e output from the first electronic circuit 110e constitute a PWM signal group having a duty ratio of 60%. The PWM signal group having a duty ratio of 50% includes PWM signals with n=3, and the PWM signal group having a duty ratio of 60% includes PWM signals with n=2.

In a case in which the PWM signal group having a duty ratio of 50% and the PWM signal group having a duty ratio of 60% are included as described above, the processor 10 sets frequencies of the PWM signal 111a, the PWM signal 111b, and the PWM signal 111c included in the PWM signal group having a duty ratio of 50% to the same frequency, and shifts phases of the PWM signal 111a and the PWM signal 111b by 120 degrees and shifts phases of the PWM signal 111b and the PWM signal 111c by 120 degrees. Then, the processor 10 sets frequencies of the PWM signal 111c and the PWM signal 111d included in the PWM signal group having a duty ratio of 60% to the same frequency, and shifts phases of both signals by 180 degrees.

As described above, in a case in which the first electronic circuit outputs n PWM signals (n is an integer of 2 or more), the electronic apparatus 100B according to the second embodiment sets frequencies of the n PWM signals to the same frequency and shifts phases of the n PWM signals by 360/n degrees. Accordingly, the phase of each noise waveform superimposed on the third electronic circuit 140 from each LPF circuit 120 via the grounds can be shifted, so that the noise waveforms can cancel each other and the noise superimposed on the output signal of the third electronic circuit 140 can be reduced.

In addition, in a case in which the plurality of PWM signals include a plurality of PWM signal groups divided according to the duty ratio, the electronic apparatus 100B shifts the phases of the PWM signals included in the PWM signal group for each PWM signal group. In this way, the noise reduction effect can be enhanced by shifting the phases of the PWM signals whose duty ratios are close to each other by 360/n degrees.

In addition, in a case in which the duty ratio is different between the PWM signals, the electronic apparatus 100B adjusts the phases of the PWM signals with respect to a center of a rising section or a center of a falling section of the PWM signal. Accordingly, even in a case in which the duty ratio is different between the PWM signals, the noise reduction effect can be enhanced.

Application Example of Second Electronic Circuit in Electronic Apparatuses 100A and 100B

Figure 19:
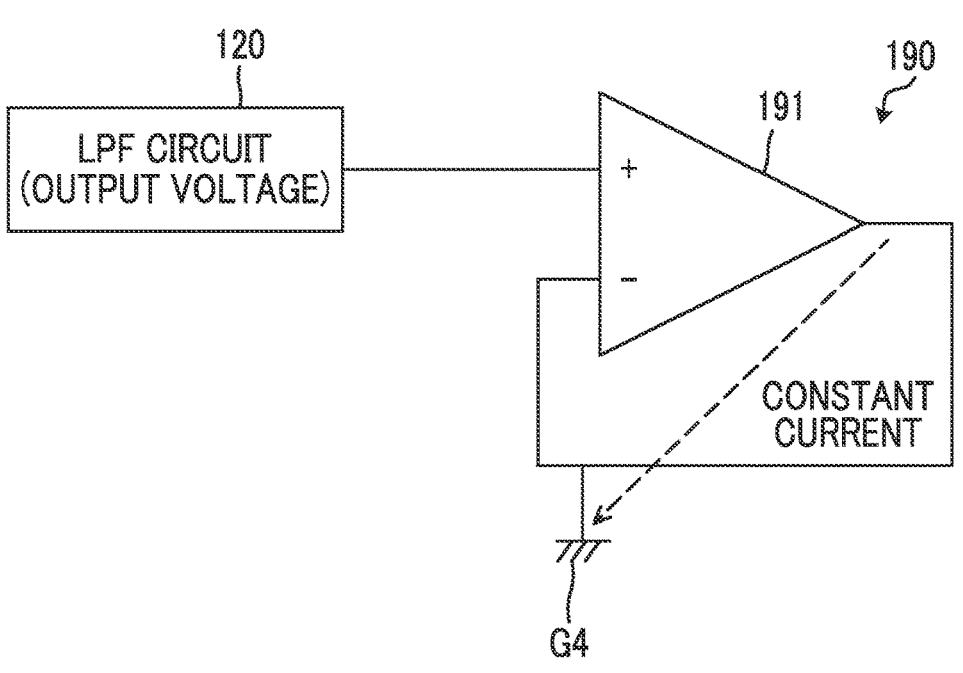
FIG. 19 is a diagram showing an example in which an output voltage of the LPF circuit 120 is used in a constant current circuit 190.

FIG. 19 is a diagram showing a first usage example of a voltage output from the LPF circuit 120 of the electronic apparatuses 100A and 100B. As shown in FIG. 19, an output voltage of the LPF circuit 120 may be used, for example, as a reference voltage input to an input terminal of an operational amplifier 191 constituting a constant current circuit 190.

Figure 20:
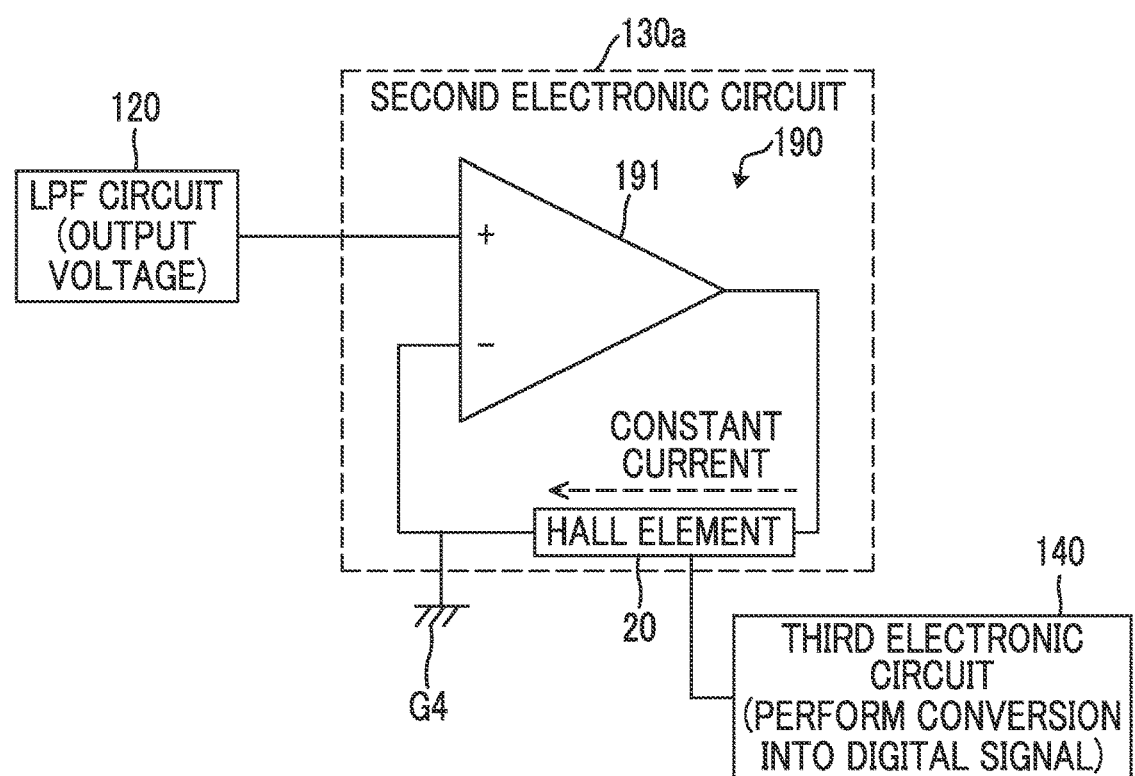
FIG. 20 is a diagram showing an example of a second electronic circuit 130a including the constant current circuit 190 of FIG. 19.

FIG. 20 is a diagram showing an example of a second electronic circuit 130a including the constant current circuit 190 of FIG. 19. As shown in FIG. 20, the second electronic circuit 130a includes the constant current circuit 190, and a hall element 20 that operates using the constant current circuit 190. The hall element 20 is a sensor capable of detecting a position of an object. The constant current circuit

190 is a circuit that supplies a constant current to the hall element 20 by using the output voltage of the LPF circuit 120. A signal output from the hall element 20, that is, an analog signal indicating a detection result of the object position is input to the AD converter (third electronic circuit 140). The second electronic circuit 130a having such a configuration is used in the electronic apparatuses 100A and 100B, whereby it is possible to reduce the influence of the noise on the output signal of the third electronic circuit 140.

Figure 21:
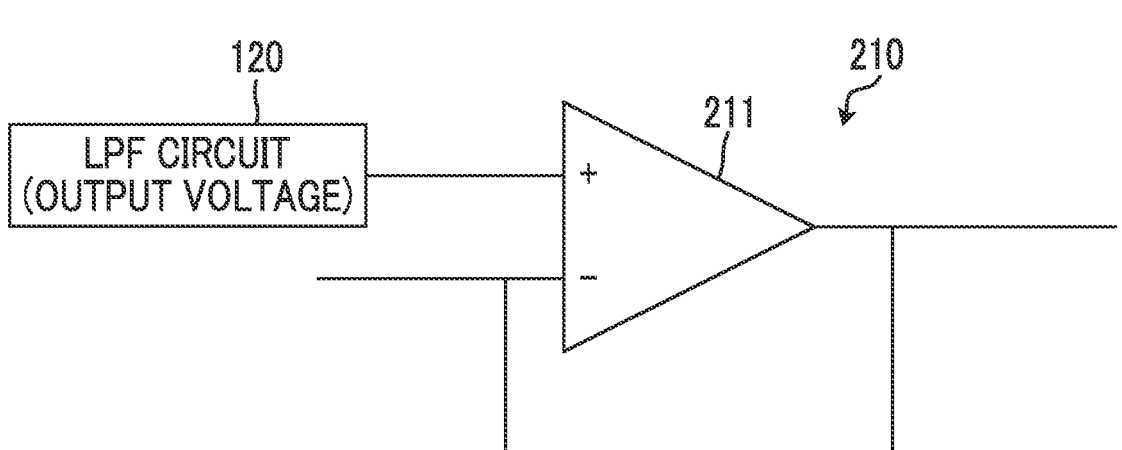
FIG. 21 is a diagram showing an example in which the output voltage of the LPF circuit 120 is used in a differential amplification circuit 210.

FIG. 21 is a diagram showing a second usage example of the voltage output from the LPF circuit 120 of the electronic apparatuses 100A and 100B. As shown in FIG. 21, an output voltage of the LPF circuit 120 may be used, for example, as a voltage input to an input terminal of an operational amplifier 211 constituting a differential amplification circuit 210.

Figure 22:
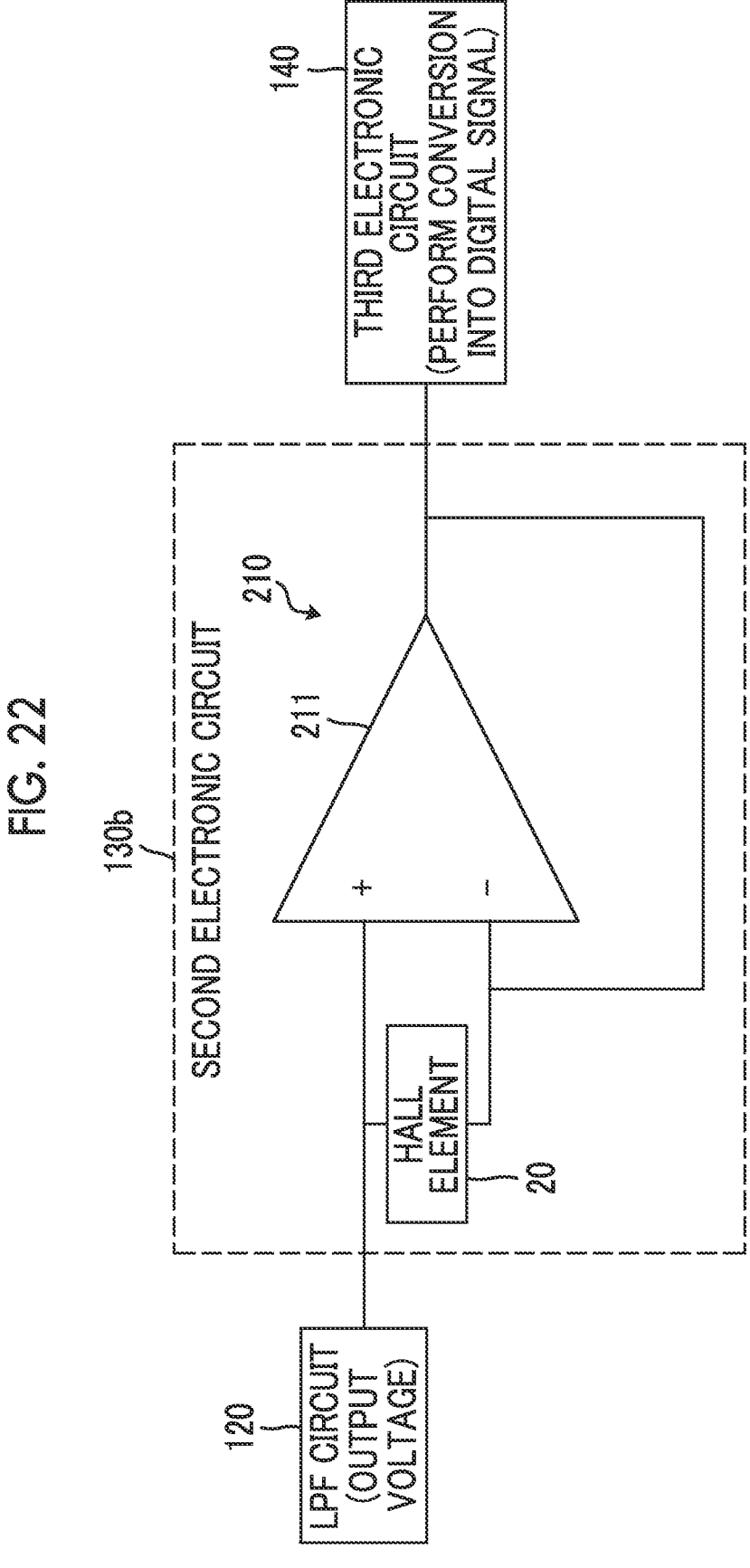
FIG. 22 is a diagram showing an example of a second electronic circuit 130b including the differential amplification circuit 210 of FIG. 21.

FIG. 22 is a diagram showing an example of a second electronic circuit 130b including the differential amplification circuit 210 of FIG. 21. As shown in FIG. 22, the second electronic circuit 130b includes a hall element 20 capable of detecting a position of an object, and a differential amplification circuit 210 that differentially amplifies the output of the hall element 20. The differential amplification circuit 210 is a circuit that amplifies a signal indicating a detection result of the hall element 20. A signal output from the operational amplifier 211, that is, an analog signal amplified by the differential amplification circuit 210 is input to the AD converter (third electronic circuit 140). The second electronic circuit 130b having such a configuration is used in the electronic apparatuses 100A and 100B, whereby it is possible to reduce the influence of the noise on the output signal of the third electronic circuit 140.

Figure 23:
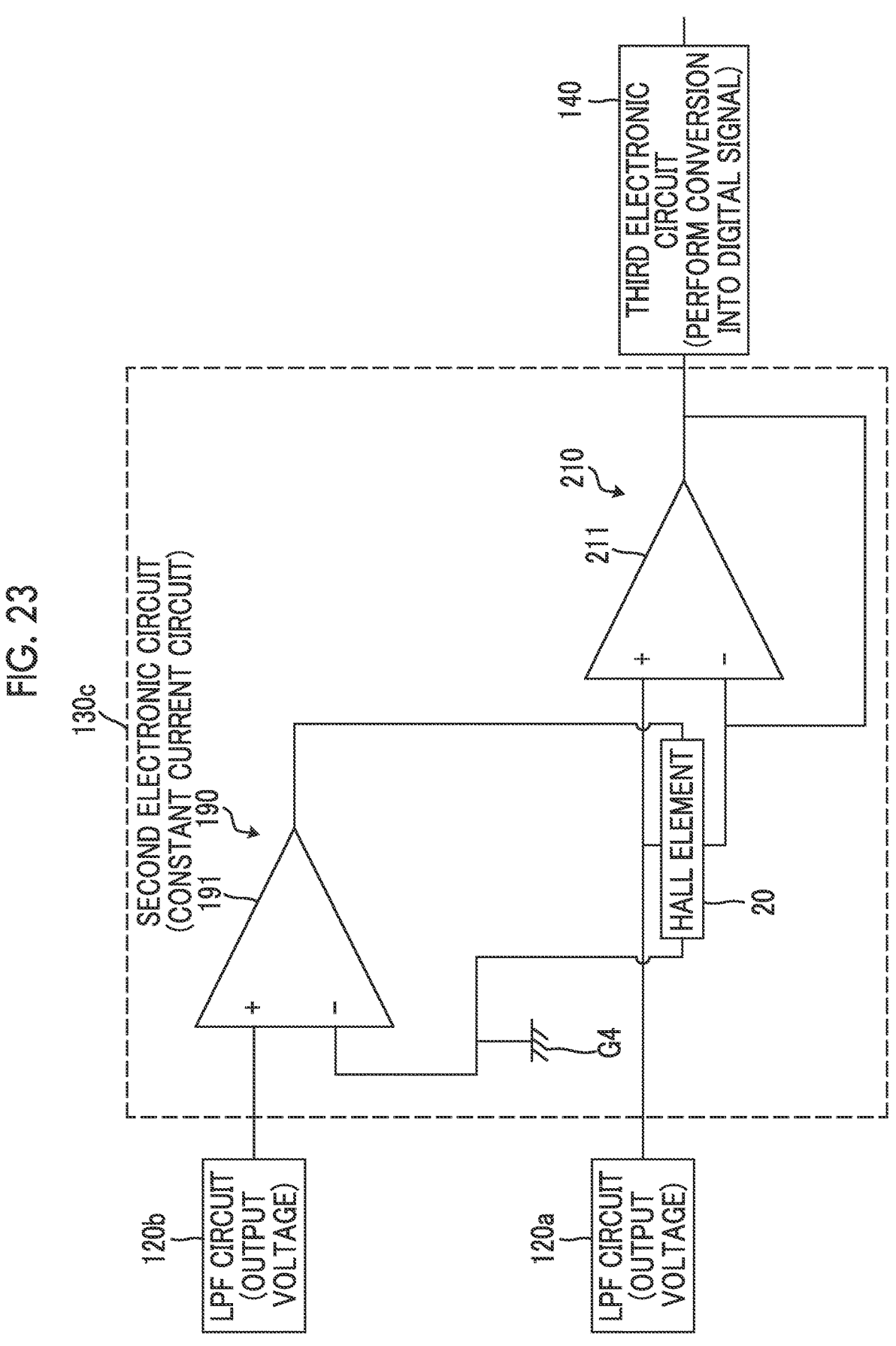
FIG. 23 is a diagram showing an example of a second electronic circuit 130c including the constant current circuit 190 and the differential amplification circuit 210.

FIG. 23 is a diagram showing a second electronic circuit 130c in which the second electronic circuit 130a including the constant current circuit 190 and the second electronic circuit 130b including the differential amplification circuit 210 are combined. As shown in FIG. 23, the second electronic circuit 130c includes the constant current circuit 190, the hall element 20 that operates using the constant current circuit 190, and the differential amplification circuit 210 that differentially amplifies the output of the hall element 20. For example, an output voltage of the LPF circuit 120b is input to the input terminal of the operational amplifier 191 constituting the constant current circuit 190. For example, an output voltage of the LPF circuit 120a is input to the input terminal of the operational amplifier 211 constituting the differential amplification circuit 210. The analog signal amplified by the differential amplification circuit 210 is input to the AD converter (third electronic circuit 140). Even in a case in which the second electronic circuit 130c having such a configuration is used in the electronic apparatuses 100A and 100B, it is possible to reduce the influence of the noise on the output signal of the third electronic circuit 140.

Figure 24:
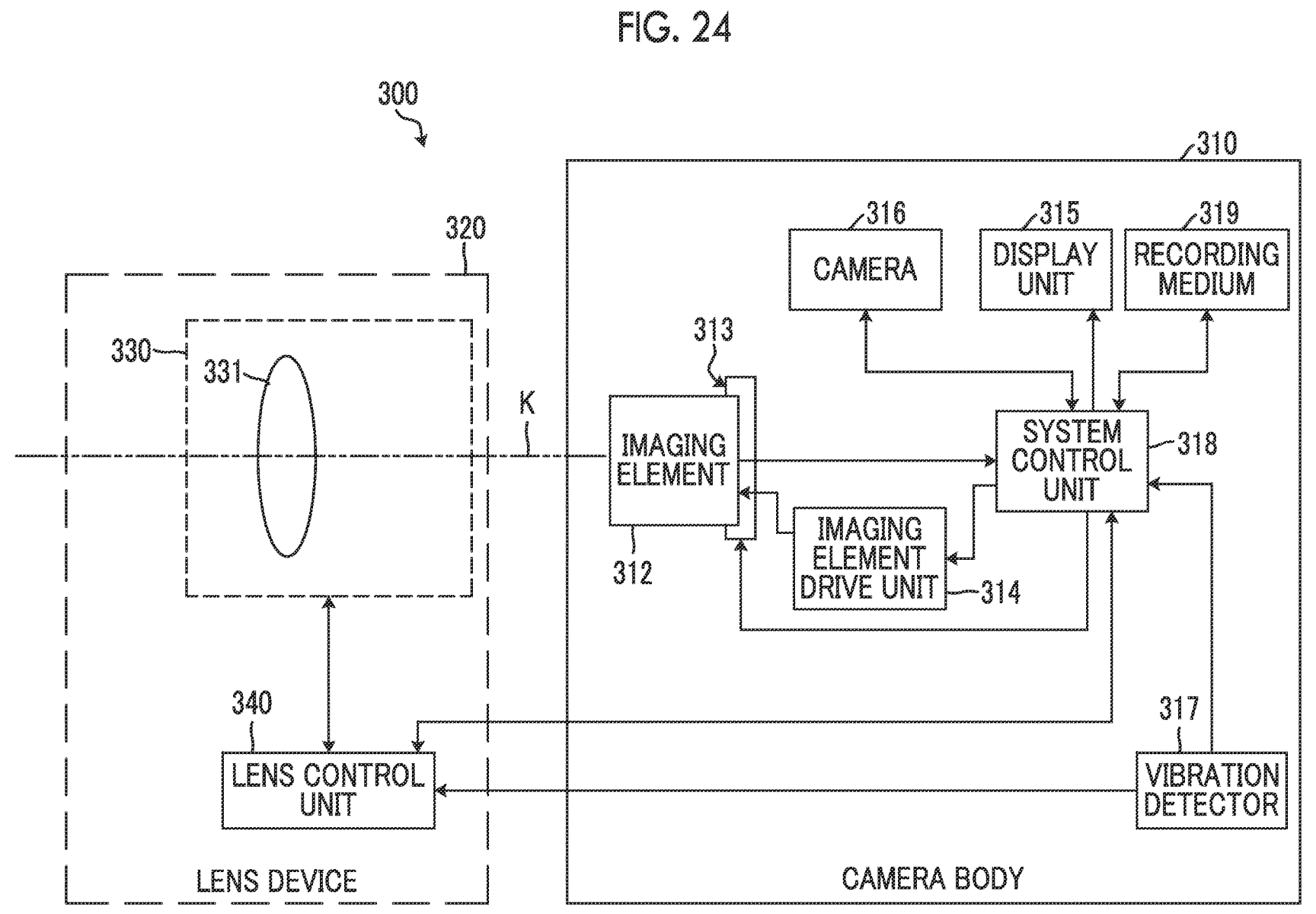

FIG. 24 is a diagram showing a digital camera 300 as an example of the electronic apparatuses 100A and 100B. The digital camera 300 comprises a camera body 310 and a lens device 320. The lens device 320 is configured to be attachable to and detachable from the camera body 310, in other words, replaceable. The lens device 320 may be integrated with the camera body 310.

The lens device 320 includes an imaging optical system 330 and a lens control unit 340. The imaging optical system 330 comprises an imaging lens 331, a stop mechanism (not shown), and the like. For example, the imaging lens 331 is composed of a single lens or a plurality of lenses including a lens for adjusting a focal point of the imaging optical system 330. The lens control unit 340 is mainly configured of a processor and controls driving of the imaging optical system 330 under control of a system control unit 318 described below.

The camera body 310 comprises an imaging element 312, an imaging element shift mechanism 313 constituting a shake correction mechanism, an imaging element drive unit 314, a display unit 315 that is a display device such as a liquid crystal display or an organic electro luminescence (EL) display, a memory 316 including a random access memory (RAM) as a volatile memory in which information is temporarily recorded, a read only memory (ROM) as a non-volatile memory in which a program and various information necessary for an operation of the program are recorded in advance, and the like, a vibration detector 317, the system control unit 318, and a recording medium 319 such as a memory card configured with a non-volatile memory.

The imaging element 312 images a subject through the imaging optical system 330. The imaging element 312 is configured of a charge coupled device (CCD) image sensor, a complementary metal oxide semiconductor (CMOS) image sensor, or the like. The imaging element 312 includes a light-receiving region 120 (see FIG. 2) in which a plurality of pixels are two-dimensionally disposed.

The imaging element shift mechanism 313 is a mechanism for preventing a shake of a subject image formed in the light-receiving region 120 of the imaging element 312 by moving the imaging element 312 in a plane perpendicular to an optical axis K of the imaging optical system 330.

The vibration detector 317 is a sensor for detecting a motion of the digital camera 300. The vibration detector 317 is configured of, for example, an acceleration sensor or an angular velocity sensor or both thereof. The vibration detector 317 may be disposed in the lens device 320. Hereinafter, the vibration detector 317 will be described as being an angular velocity sensor.

The system control unit 318 controls the entire digital camera 300 in an integrated manner, and a hardware structure of the system control unit 318 corresponds to various processors that perform processing by executing programs including a shake correction program.

The various processors include a central processing unit (CPU) that is a general-purpose processor executing a program to perform various types of processing, a programmable logic device (PLD) that is a processor of which a circuit configuration can be changed after manufacturing such as a field programmable gate array (FPGA), or a dedicated electric circuit that is a processor having a circuit configuration designed to be dedicated to executing specific processing such as an application specific integrated circuit (ASIC). More specifically, structures of the various processors are electric circuits in which circuit elements such as semiconductor elements are combined. The system control unit 318 may be configured of one of the various processors, or may be configured of a combination of two or more processors of the same type or different types (for example, a combination of a plurality of FPGAs or a combination of a CPU and an FPGA).

The system control unit 318 causes the imaging element 312 to image the subject by controlling the imaging element drive unit 314 and outputs a captured image signal corresponding to the subject image formed in the light-receiving region 120 of the imaging element 312 from the imaging element 312. The system control unit 318 generates an image of a format such as Joint Photographic Experts Group (JPEG) format reproducible by the digital camera 300 or another apparatus by performing image processing on the captured image signal output from the light-receiving region 120 of the imaging element 312.

In imaging the subject by the imaging element 312, the system control unit 318 corrects a shake of an image captured by the imaging element 312 by controlling the imaging element shift mechanism 313 based on vibration information (specifically, angular velocity) of the digital camera 300 detected by the vibration detector 317. A blur correction device is configured by the system control unit 318, the vibration detector 317, and the imaging element shift mechanism 313.

As an example, the hall element 20 shown in FIGS. 20 and 22 is used for position detection (position detection for sensor anti-vibration) of the imaging element 312. As described above, in a case in which the electronic apparatuses 100A and 100B are the digital camera 300, the hall element 20 having a function of detecting the position of the imaging element 312 corresponds to the second electronic circuit 130, and the AD converter that converts the analog signal (the signal indicating the detection result of the hall element 20) output from the hall element 20 into the digital signal and outputs the digital signal to the system control unit 318 corresponds to the third electronic circuit 140. With such a configuration, the influence of the noise on the signal (the signal indicating the detection result of the hall element 20) output to the system control unit 318 can be reduced, the system control unit 318 can detect the position of the imaging element 312 with high accuracy, and correction accuracy of the image shake can be improved.

EXPLANATION OF REFERENCES

10: processor
20: hall element
100A, 100B: electronic apparatus
110 (110a, 110b): first electronic circuit
111: PWM signal
120 (120a, 120b): LPF circuit
121: analog voltage
130 (130a to 130c): second electronic circuit
140: third electronic circuit
190: constant current circuit
191: operational amplifier
210: differential amplification circuit
211: operational amplifier
300: digital camera
310: camera body
312: imaging element
313: imaging element shift mechanism
314: imaging element drive unit
315: display unit
316: memory
317: vibration detector
318: system control unit
319: recording medium
320: lens device
330: imaging optical system
331: imaging lens
340: lens control unit
Fn: PWM frequency
Fs: sampling frequency
Fs/2: Nyquist frequency
N1 to N5: aliasing noise

What is claimed is:
1. An electronic apparatus comprising:
a processor;

a first electronic circuit is configured to output a pulse width modulation signal having a frequency;

a low-pass filter circuit is configured to output a voltage based on the pulse width modulation signal;

a second electronic circuit is configured to output an analog signal by using the output voltage of the low-pass filter circuit; and a third electronic circuit is configured to convert the analog signal into a digital signal, wherein a harmonic noise which is a noise component having the same frequency as the frequency of the pulse width modulation signal is generated by the first electronic circuit and is superimposed on the third electronic circuit and is converted into an aliasing noise in the digital signal, and the processor is configured to set the frequency of the pulse width modulation signal to a frequency, wherein the aliasing noise at the frequency included in the digital signal does not appear in a frequency band equal to or less than $\frac{1}{4}$ of a sampling frequency of the third electronic circuit, wherein the first electronic circuit is configured to output n pulse width modulation signals, n is an integer of 2 or more, and the processor is configured to perform control of setting frequencies of the n pulse width modulation signals to a same frequency and shifting phases of the n pulse width modulation signals by 360/n degrees respectively.

2. The electronic apparatus according to claim 1, wherein the noise component is generated at a frequency corresponding to the frequency of the pulse width modulation signal and the sampling frequency, in a case in which the frequency of the pulse width modulation signal is denoted by Fn and the sampling frequency is denoted by Fs, the processor is configured to set the frequency of the pulse width modulation signal to satisfy $NFs+Fs/4 \leq Fn \leq (N+1)Fs-Fs/4$, and N is an integer of 0 or more.

3. The electronic apparatus according to claim 2, wherein the analog signal is a signal having a frequency equal to or less than $\frac{1}{4}$ of the sampling frequency as a usage band.

4. The electronic apparatus according to claim 1, wherein the noise component is generated at a frequency corresponding to the frequency of the pulse width modulation signal and the sampling frequency, in a case in which the frequency of the pulse width modulation signal is denoted by Fn and the sampling frequency is denoted by Fs, the processor is configured to set the frequency of the pulse width modulation signal to satisfy $Fn=NFs-Fs/4$ or $Fn=NFs+Fs/4$, and N is an integer of 1 or more.

5. The electronic apparatus according to claim 4, wherein the analog signal is a signal having a frequency equal to or less than $\frac{1}{4}$ of the sampling frequency as a usage band.

6. The electronic apparatus according to claim 1, wherein the n pulse width modulation signals include a plurality of pulse width modulation signal groups divided according to a duty ratio, and the processor is configured to perform control of shifting the phase of the pulse width modulation signal included in the pulse width modulation signal group for each of the pulse width modulation signal groups.

7. The electronic apparatus according to claim 6, wherein the analog signal is a signal having a frequency equal to or less than $\frac{1}{4}$ of the sampling frequency as a usage band.

8. The electronic apparatus according to claim 1, wherein a ground of the low-pass filter circuit and a ground of the third electronic circuit are electrically connected to each other.

9. The electronic apparatus according to claim 8, wherein the analog signal is a signal having a frequency equal to or less than $\frac{1}{4}$ of the sampling frequency as a usage band.

10. The electronic apparatus according to claim 1, wherein the second electronic circuit includes a sensor having at least a function of detecting a position of an object, and the analog signal is a signal indicating a detection result of the sensor.

11. The electronic apparatus according to claim 10, wherein the second electronic circuit includes a constant current circuit that is configured to supply a constant current to the sensor by using the output voltage of the low-pass filter circuit.

12. The electronic apparatus according to claim 11, wherein the analog signal is a signal having a frequency equal to or less than $\frac{1}{4}$ of the sampling frequency as a usage band.

13. The electronic apparatus according to claim 10, wherein the analog signal is a signal having a frequency equal to or less than $\frac{1}{4}$ of the sampling frequency as a usage band.

14. The electronic apparatus according to claim 1, wherein the second electronic circuit includes an amplification circuit that is configured to amplify a signal indicating a detection result of a sensor having at least a function of detecting a position of an object by using the output voltage of the low-pass filter circuit, and the analog signal is a signal amplified by the amplification circuit.

15. The electronic apparatus according to claim 14, wherein the analog signal is a signal having a frequency equal to or less than $\frac{1}{4}$ of the sampling frequency as a usage band.

16. The electronic apparatus according to claim 1, wherein the analog signal is a signal having a frequency equal to or less than $\frac{1}{4}$ of the sampling frequency as a usage band.

\* \* \* \* \*